(12) United States Patent
Wang et al.

(10) Patent No.: US 10,090,272 B2
(45) Date of Patent: Oct. 2, 2018

(54) CHIP PACKAGE AND CHIP PACKAGING METHOD

(71) Applicant: Industrial Technology Research Institute, Hsinchu (TW)

(72) Inventors: Chao-Jen Wang, Hsinchu (TW); Chih-Chia Chang, Hsinchu County (TW); Jia-Chong Ho, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 22 days.

(21) Appl. No.: 15/394,814

(22) Filed: Dec. 30, 2016

(65) Prior Publication Data

US 2018/0130760 A1 May 10, 2018

(30) Foreign Application Priority Data

Nov. 7, 2016 (TW) .............................. 105136156 A

(51) Int. Cl.
*H01L 23/00* (2006.01)
*H01L 23/31* (2006.01)
(Continued)

(52) U.S. Cl.
CPC ............ *H01L 24/20* (2013.01); *H01L 21/027* (2013.01); *H01L 21/3105* (2013.01);
(Continued)

(58) Field of Classification Search
CPC ......... H01L 2224/97; H01L 2924/3511; H01L 2224/82; H01L 2924/181; H01L 24/19;
(Continued)

(56) References Cited

U.S. PATENT DOCUMENTS 7,619,304 B2 * 11/2009 Bauer ................... H01L 21/561
257/677
7,642,128 B1 * 1/2010 Lin ..................... H01L 21/6835
257/E21.508
(Continued)

FOREIGN PATENT DOCUMENTS

CN 102779767 11/2012
TW 200845213 11/2008
(Continued)

OTHER PUBLICATIONS

"Office Action of Taiwan Counterpart Application," dated Jul. 25, 2017, p. 1-p. 5.

*Primary Examiner* — Bac Au
(74) *Attorney, Agent, or Firm* — JCIPRNET

(57) ABSTRACT

According to an embodiment of the present disclosure, a chip package including at least one chip, a first encapsulation layer, a redistribution layer, and a second encapsulation layer is provided. The at least one chip has an active surface, a back surface opposite to the active surface, and sidewall surfaces connecting the active surface and the back surface. The first encapsulation layer covers the sidewall surfaces. The first encapsulation layer has a first surface and a second surface opposite to the first surface. The redistribution layer is disposed on the active surface and the first surface, and electrically connected to the at least one chip. The second encapsulation layer is disposed on the back surface and the second surface. A thermal expansion coefficient of the second encapsulation layer is less than a thermal expansion coefficient of the first encapsulation layer. Chip packaging methods are also provided.

12 Claims, 20 Drawing Sheets

(51) Int. Cl.

| | | |
|---|---|---|
| *H01L 23/522* | (2006.01) | |
| *H01L 21/56* | (2006.01) | |
| *H01L 21/027* | (2006.01) | |
| *H01L 21/683* | (2006.01) | |
| *H01L 21/3105* | (2006.01) | |
| *H01L 23/367* | (2006.01) | |

(52) U.S. Cl.
CPC ......... *H01L 21/565* (2013.01); *H01L 21/568* (2013.01); *H01L 21/6835* (2013.01); *H01L 23/3114* (2013.01); *H01L 23/3135* (2013.01); *H01L 23/367* (2013.01); *H01L 23/5226* (2013.01); *H01L 24/19* (2013.01); *H01L 2221/68359* (2013.01); *H01L 2224/211* (2013.01)

(58) Field of Classification Search
CPC ....... H01L 2924/14; H01L 2224/04105; H01L 2224/83; H01L 21/568; H01L 2224/12105; H01L 2224/96; H01L 24/96; H01L 24/97; H01L 2924/18162; H01L 2224/11; H01L 2224/92; H01L 2224/92244; H01L 23/3128; H01L 23/5389; H01L 21/78; H01L 2224/0401; H01L 2224/05552; H01L 2224/20; H01L 23/3135; H01L 24/20; H01L 21/6835; H01L 2221/68327; H01L 2221/6834; H01L 2221/68372; H01L 2221/68381; H01L 2224/05548; H01L 2224/05567; H01L 2224/13022; H01L 2224/13024; H01L 2224/83191; H01L 2225/1035; H01L 2225/1041; H01L 2225/1052; H01L 2225/1058; H01L 2225/107; H01L 23/16; H01L 23/3171; H01L 23/49534; H01L 24/18; H01L 24/24
See application file for complete search history.

(56) References Cited

U.S. PATENT DOCUMENTS

| | | | |
|---|---|---|---|
| 8,263,437 B2* | 9/2012 | Lin | .......................... H01L 25/16 |
| | | | 257/E23.116 |
| 8,502,367 B2 | 8/2013 | Luan | |
| 9,064,936 B2* | 6/2015 | Lin | ...................... H01L 21/6836 |
| 9,184,104 B1* | 11/2015 | Chia | ...................... H01L 23/481 |
| 9,257,341 B2 | 2/2016 | Gerber | |
| 9,385,102 B2* | 7/2016 | Lin | ...................... H01L 21/4853 |
| 9,484,279 B2* | 11/2016 | Pagaila | ................. H01L 21/561 |
| 9,524,959 B1* | 12/2016 | Yeh | .................. H01L 21/76877 |
| 9,589,842 B2* | 3/2017 | Choi | ........................ H01L 21/78 |
| 9,589,920 B2* | 3/2017 | Hurwitz | ................ H01L 23/291 |
| 2011/0156239 A1 | 6/2011 | Jin | |
| 2011/0198762 A1 | 8/2011 | Scanlan | |
| 2011/0278736 A1* | 11/2011 | Lin | .......................... H01L 25/50 |
| | | | 257/774 |
| 2012/0187568 A1* | 7/2012 | Lin | .................. H01L 21/76898 |
| | | | 257/774 |
| 2012/0244664 A1 | 9/2012 | Jin et al. | |
| 2013/0075936 A1* | 3/2013 | Lin | .......................... H01L 24/19 |
| | | | 257/777 |
| 2013/0249101 A1* | 9/2013 | Lin | ...................... H01L 23/3121 |
| | | | 257/773 |
| 2013/0295725 A1* | 11/2013 | Park | ........................ H01L 24/19 |
| | | | 438/124 |
| 2015/0008566 A1 | 1/2015 | Gerber et al. | |
| 2015/0179481 A1 | 6/2015 | Lin | |
| 2015/0179616 A1* | 6/2015 | Lin | .......................... H01L 25/50 |
| | | | 257/773 |
| 2017/0133334 A1* | 5/2017 | Kim | .................... H01L 23/3157 |

FOREIGN PATENT DOCUMENTS

| | | |
|---|---|---|
| TW | 201044471 | 12/2010 |
| TW | 201405678 | 2/2014 |
| TW | 201519331 | 5/2015 |

* cited by examiner

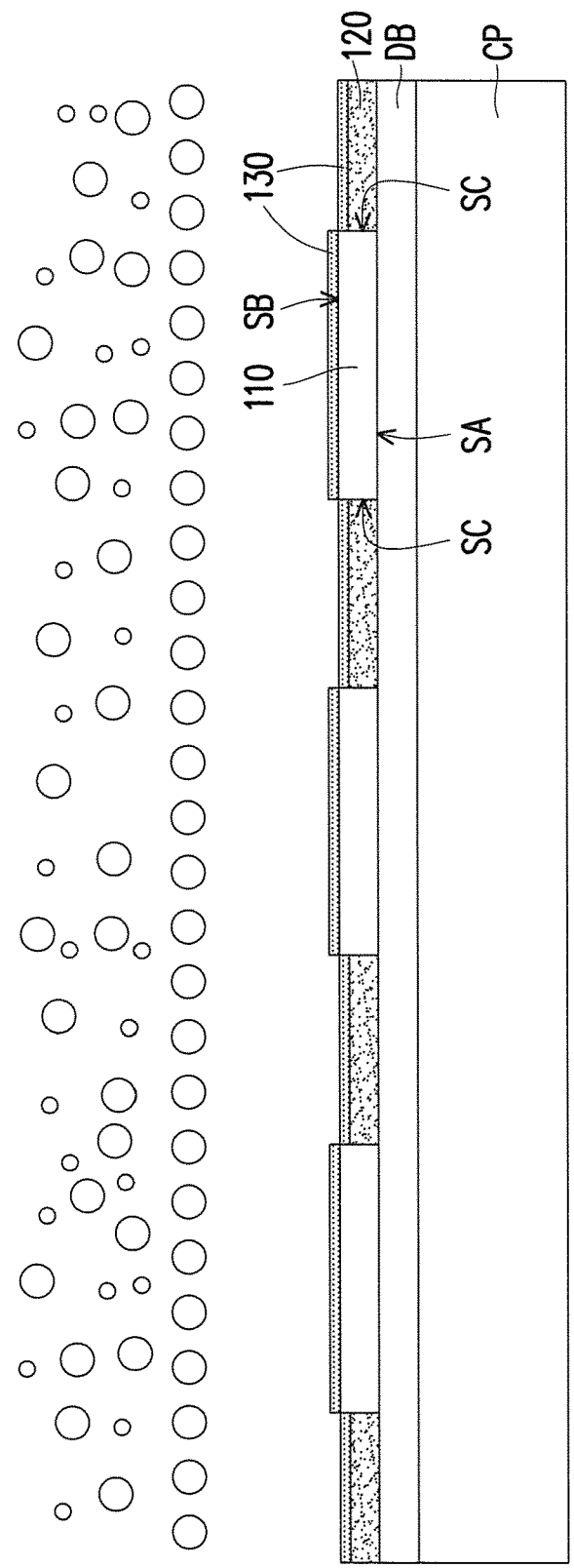

CHIP PACKAGE AND CHIP PACKAGING METHOD

CROSS-REFERENCE TO RELATED APPLICATION

This application claims the priority benefits of a Taiwan application serial no. 105136156, filed on Nov. 7, 2016. The entirety of the above-mentioned patent application is hereby incorporated by reference herein.

TECHNICAL FIELD

The disclosure relates to a semiconductor device and fabricating methods of the semiconductor device, and particularly relates to a chip package and methods of fabricating the chip package.

BACKGROUND

Due to the needs for portability and multi-functionality of the consumer electronics, the semiconductor devices are developed to exhibit a smaller size, a higher performance, and a lower cost. With the advantage of being a small-sized package, wafer-level packages (WLP) meet the market trend of electronic products. Among the WLP techniques, the fan-out panel level package (FO-PLP) carrying a chip with a large-sized plate substrate and adopting a redistribution layer is able to facilitate the yield. Thus, FO-PLP has become one of the promising techniques.

Currently, FO-PLP may adopt two types of fabricating processes. In one of the types, the redistribution layer is fabricated after the chip is encapsulated by a molding compound material. In the other type, the redistribution layer is fabricated, the chip is electrically connected to the redistribution layer, and then, the molding compound is formed. In these types of fabricating processes, the issues of non-planarity, alignment precision, and warpage may easily occur in the large-sized plate substrate, the difference in thermal expansion coefficient as well as the difference in internal stress between the layers and between the layers and the chips during the molding process. Accordingly, how to reduce the non-planarity and warpage and facilitate the alignment precision have become the issues for people skilled in the art to work on.

SUMMARY

An embodiment of the disclosure provides a chip package. The chip package may include at least one chip, a first encapsulation layer, a redistribution layer, and a second encapsulation layer. The at least one chip includes an active surface, a back surface opposite to the active surface, and a plurality of sidewall surfaces connecting the active surface and the back surface. The first encapsulation layer covers the sidewall surfaces of the at least one chip, wherein the first encapsulation layer has a first surface and a second surface opposite to the first surface. The redistribution layer is disposed on the active surface of the at least one chip and the first surface of the first encapsulation layer, and electrically connected to the at least one chip. The second encapsulation layer is disposed on the back surface of the at least one chip and the second surface of the first encapsulation layer, wherein a thermal expansion coefficient of the second encapsulation layer is less than a thermal expansion coefficient of the first encapsulation layer.

An embodiment of the disclosure provides a chip packaging method. The method may include but not limited to following steps: disposing at least one chip on a carrier, wherein the at least one chip has an active surface, a back surface opposite to the active surface, and a plurality of sidewall surfaces connecting the active surface and the back surface, and the active surface is located between the back surface and the carrier; forming a first encapsulation layer on the carrier, wherein the first encapsulation layer covers the sidewall surfaces of the at least one chip to expose the active surface and the back surface of the at least one chip; forming a second encapsulation layer on the first encapsulation layer and the back surface of the at least one chip, wherein a thermal expansion coefficient of the second encapsulation layer is less than a thermal expansion coefficient of the first encapsulation layer; departing the at least one chip and the first encapsulation layer from the carrier to expose the active surface of the at least one chip; and forming a redistribution layer on the first encapsulation layer and the active surface of the at least one chip, wherein the redistribution layer is electrically connected to the at least one chip.

An embodiment of the disclosure provides a chip packaging method. The method may include but not limited to following steps: forming a redistribution layer on a carrier; disposing at least one chip on the redistribution layer, wherein the at least one chip is electrically connected to the redistribution layer and has an active surface, a back surface opposite to the active surface, and a plurality of sidewall surfaces connecting the active surface and the back surface, and the active surface is located between the back surface and the redistribution layer; forming a first encapsulation layer on the redistribution layer, wherein the first encapsulation layer covers the sidewall surfaces of the at least one chip to expose the back surface of the at least one chip; forming a second encapsulation layer on the first encapsulation layer and the back surface of the at least one chip, wherein a thermal expansion coefficient of the second encapsulation layer is less than a thermal expansion coefficient of the first encapsulation layer; and departing the redistribution layer from the carrier.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 5A to 5C are schematic cross-sectional views illustrating part of a chip packaging method according to a fifth embodiment of the disclosure.

DETAILED DESCRIPTION OF DISCLOSED EMBODIMENTS

Figure 1A:
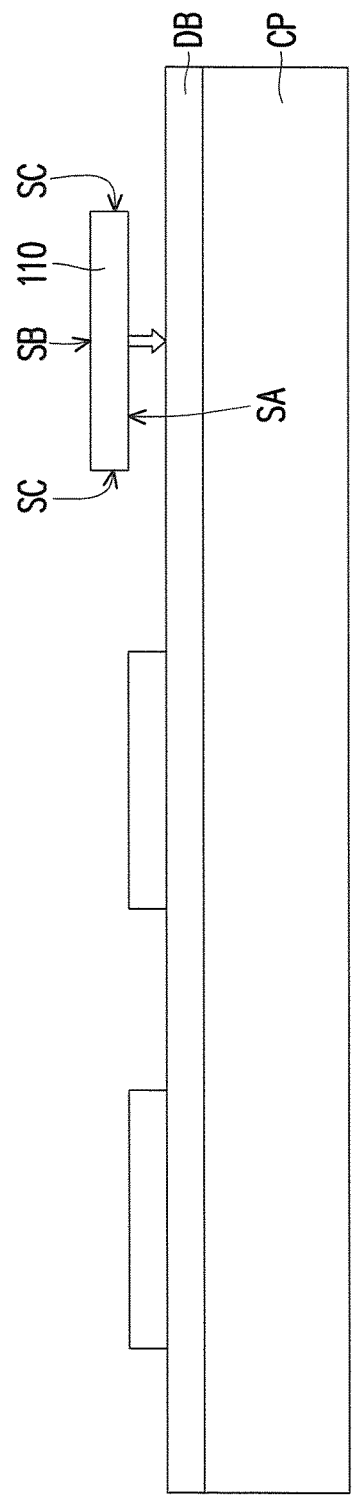
FIGS. 1A to 1G are schematic cross-sectional views illustrating a chip packaging method according to a first embodiment of the disclosure.

FIGS. 1A to 1G are schematic cross-sectional views illustrating a chip packaging method according to a first embodiment of the disclosure. Referring to FIG. 1A, at least one chip 110 is disposed on a carrier CP. The carrier CP may be a glass substrate or a ceramic substrate. However, the disclosure is not limited thereto. The at least one chip 110 has an active surface SA, a back surface SB, and a plurality of sidewall surfaces SC. The back surface SB is opposite to the active surface SA, and the sidewall surfaces SC connect the active surface SA and the back surface SB.

In the embodiment, before the at least one chip 110 is disposed on the carrier CP, a releasing layer DB may be formed in advance on the carrier CP, so as to temporarily fix the at least one chip 110 on the carrier CP through the releasing layer DB. In addition, the at least one chip 110 covers the releasing layer DB by flip chip, so as to locate the active surface SA between the back surface SB and the carrier CP.

Figure 1B:
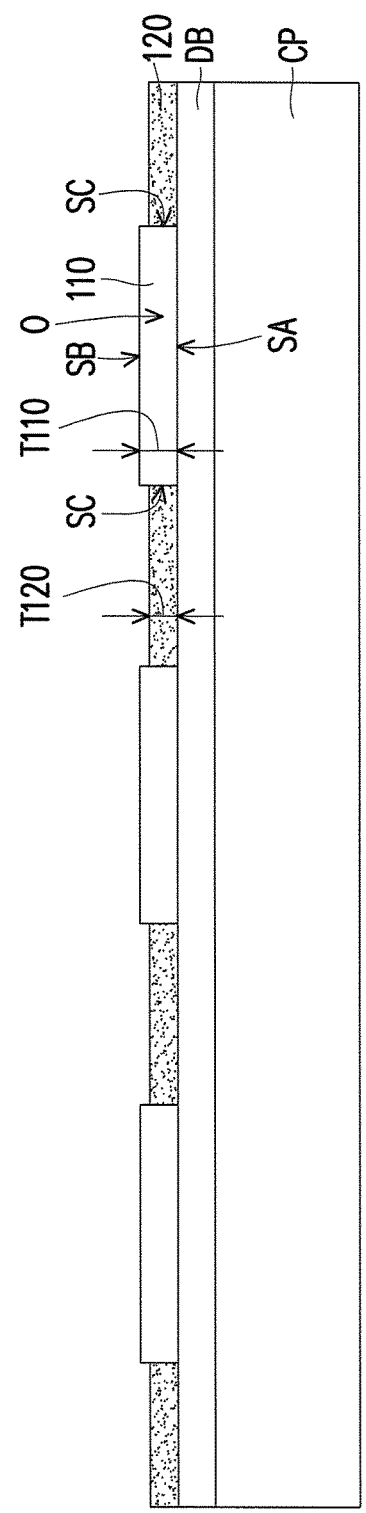

Referring to FIG. 1B, a first encapsulation layer 120 is formed on the carrier CP. A material of the first encapsulation layer 120 may include an elastic material, a thermoplastic material, a thermosetting material, a composite material, silicone, or other suitable resin, such as epoxy resin or a composite material including the epoxy resin. However, it should be understood that the disclosure is not limited thereto.

The first encapsulation layer 120 covers the sidewall surfaces SC of the at least one chip 110, and exposes the back surface SB of the at least one chip 110 to form at least one opening O accommodating the at least one chip 110. A location of the opening O is a location occupied by the at least one chip 110 in the first encapsulation layer 120. In addition, the number of the opening O is the same as the number of the at least one chip 110. The opening O forms a stress releasing hole of the first encapsulation layer 120. Thus, the first encapsulation layer 120 is not a continuous film.

In the embodiment, a thickness T120 of the first encapsulation layer 120 is less than a thickness T110 of the at least one chip 110. Based on different design needs, the thickness T120 of the first encapsulation layer 120 may also be greater than or equal to the thickness T110 of the at least one chip 110.

Figure 1C:
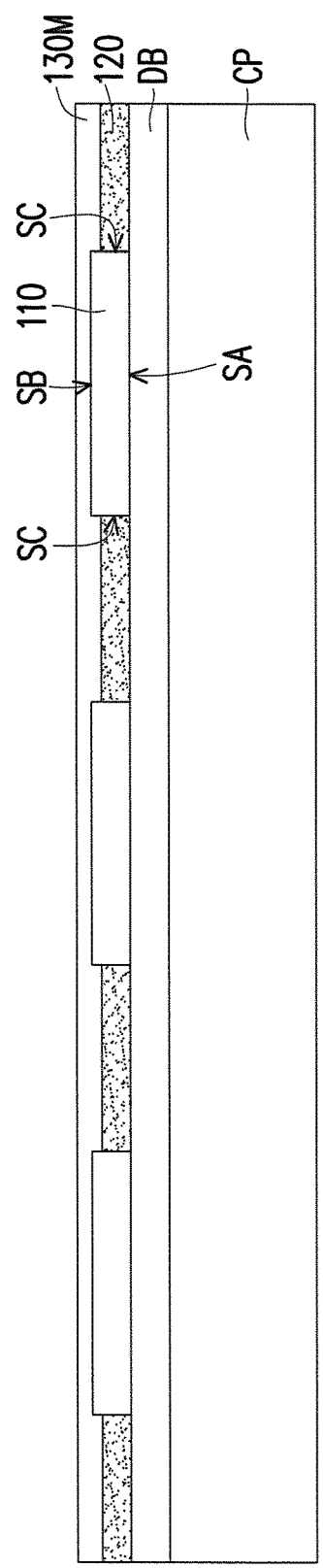

Referring to FIG. 1C, a second encapsulation material layer 130M is formed on the first encapsulation layer 120 and the back surface SB of the at least one chip 110 by performing a molding process. A material of the second encapsulation material layer 130M includes, for example, polysilazane compound, a polysilazoxane compound or a polysiloxane compound. However, the disclosure is not limited thereto.

Figure 1D:
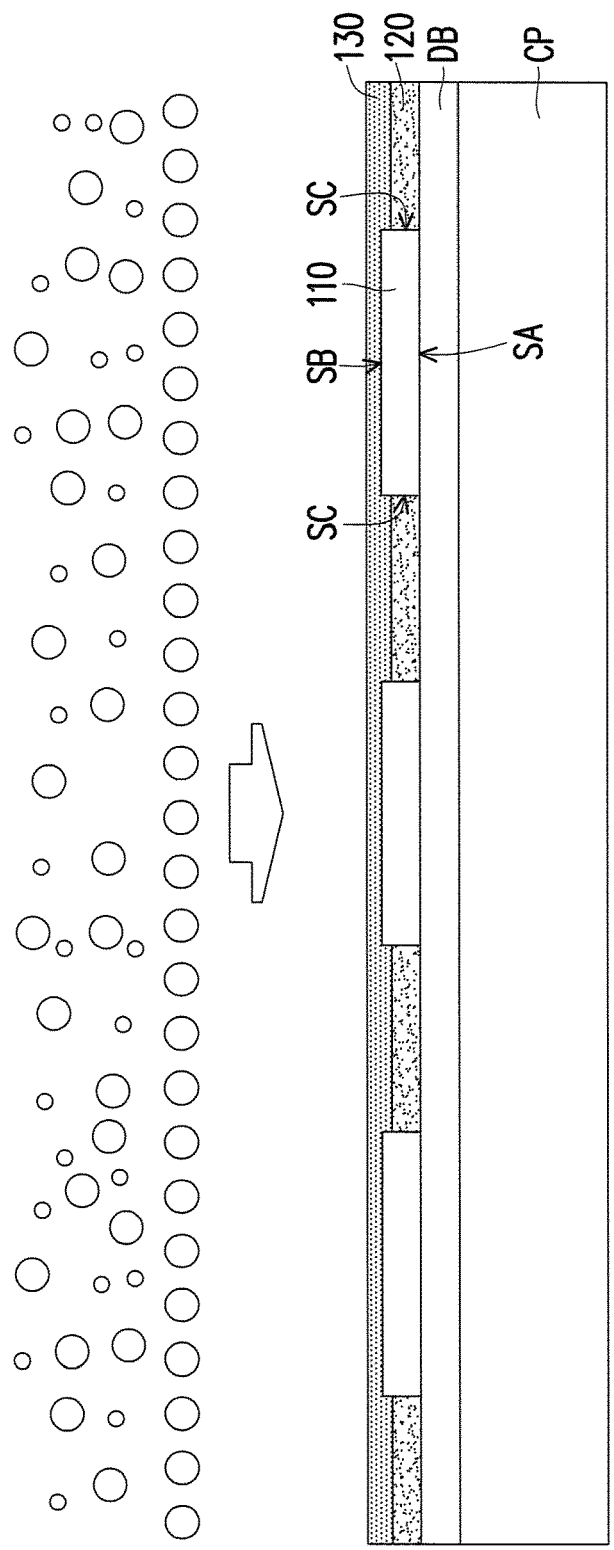

Referring to FIG. 1D, at least one surface treatment process is performed on the second encapsulation material layer 130M, so as to form a second encapsulation layer 130 on the first encapsulation layer 120 and the back surface SB of the at least one chip 110. In addition, a thermal expansion coefficient of the second encapsulation layer 130 is less than a thermal expansion coefficient of the first encapsulation layer 120. The surface treatment process may include a plasma surface treatment, for example. However, the disclosure is not limited thereto.

By performing the surface treatment process, the second encapsulation material layer 130M may become more densified. A degree of densification of the second encapsulation layer 130 is related to a ratio between nitrogen and oxygen of the second encapsulation layer 130. In an embodiment, the ratio between nitrogen and oxygen of the second encapsulation layer 130 may be modulated by modifying power of the surface treatment, so as to adjust the thermal expansion coefficient and an internal stress of the second encapsulation layer 130.

Figure 1E:
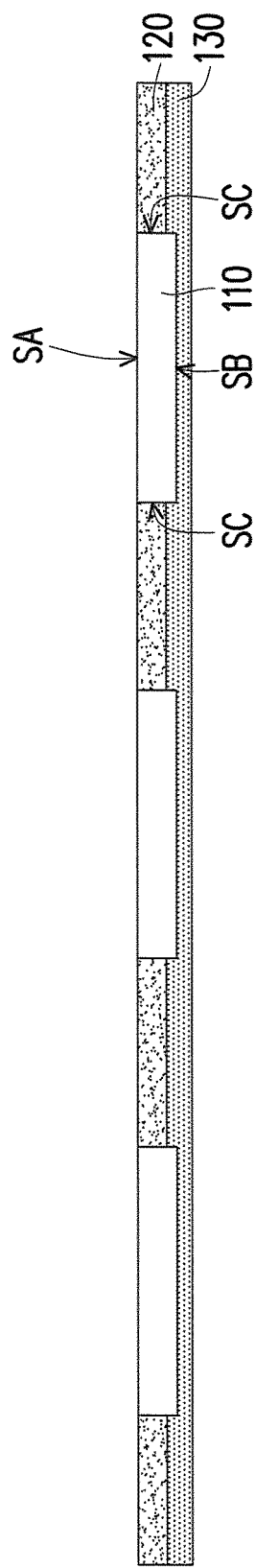

Referring to FIG. 1E, the at least one chip 110 and the first encapsulation layer 120 are departed from the carrier CP, so as to expose the active surface SA of the at least one chip 110. In the embodiment, the at least one chip 110 is formed on the releasing layer DB, as shown in FIG. 1D. In a peeling process shown in FIG. 1E, the at least one chip 110 and the first encapsulation layer 120 are departed from the releasing layer DB. After the peeling process, a reversing process may be performed to make the active surface SA of the at least one chip 110 face upward for subsequent processing.

Figure 1F:
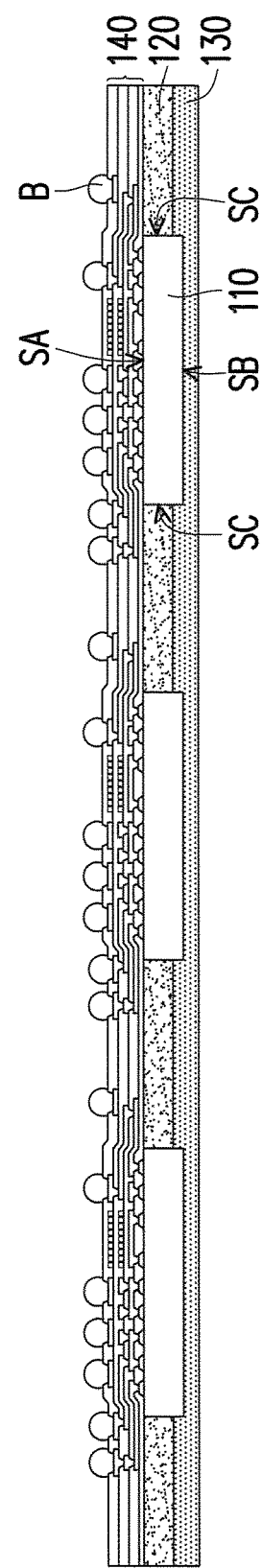

Referring to FIG. 1F, a redistribution layer 140 is formed on the first encapsulation layer 120 and the active surface SA of the at least one chip 110. In addition, the redistribution layer 140 is electrically connected to the at least one chip 110. In the embodiment, a plurality of conductive bumps B electrically connected to the redistribution layer 140 may be further formed on the redistribution layer 140. The conductive bumps B may be copper bumps, for example. However, the disclosure is not limited thereto.

Figure 1G:
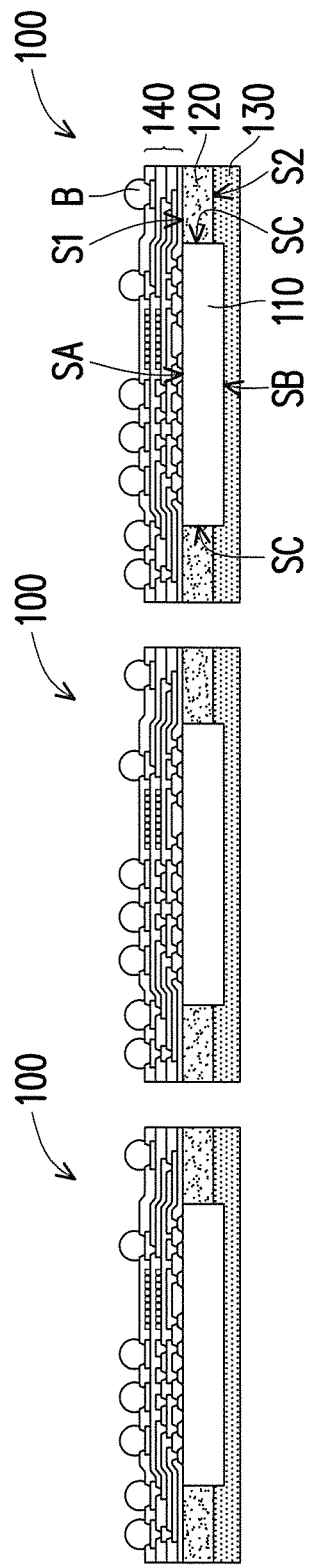

Referring to FIG. 1G, a plurality of chip packages 100 may be formed by performing a die cutting process. The second encapsulation layer 130 of each of the chip packages 100 may be a continuous film and has a uniform thermal expansion coefficient. Each of the chip packages 100 includes the at least one chip 110, the first encapsulation layer 120, the redistribution layer 140, and the second encapsulation layer 130. The at least one chip 110 has the active surface SA, the back surface SB opposite to the active surface SA, and the sidewall surfaces SC connecting the active surface SA and the back surface SB. The first encapsulation layer 120 covers the sidewall surfaces SC of the at least one chip 110. In addition, the first encapsulation layer 120 has a first surface S1 and a second surface S2 opposite to the first surface S1. The redistribution layer 140 is disposed on the active surface SA of the at least one chip 110 and the first surface S1 of the first encapsulation layer 120. In addition, the redistribution layer 140 is electrically connected to the at least one chip 110. The second encapsulation layer 130 is disposed on the back surface SB of the at least one chip 110 and the second surface S2 of the first encapsulation layer 120. In addition, the thermal expansion coefficient of the second encapsulation layer 130 is less than the thermal expansion coefficient of the first encapsulation layer 120.

Since the thermal expansion coefficient of the first encapsulation layer 120 is greater than a thermal expansion coefficient of the at least one chip 110, a difference in thermal expansion coefficient between the at least one chip 110 and the encapsulation layer (i.e., the second encapsulation layer 130) on the at least one chip 110 may be reduced by forming the second encapsulation layer 130 having a less thermal expansion coefficient (closer to the thermal expansion coefficient of the at least one chip 110) on the back surface SB of the at least one chip 110. In addition, the first encapsulation layer 120 has at least one stress releasing hole accommodating the at least one chip 110 to release a stress of the first encapsulation layer 120. Accordingly, the non-planarity and warpage are able to be reduced, and the alignment precision is able to be facilitated. Besides, the second encapsulation layer 130 may also dissipate heat.

In the following, other chip packaging methods according to the disclosure are described with reference to FIGS. 2A to 6H. Besides, in FIGS. 2A to 9, like or similar components are referred to with like or similar reference symbols, and details of the like or similar components will be omitted in the following.

Figure 2A:
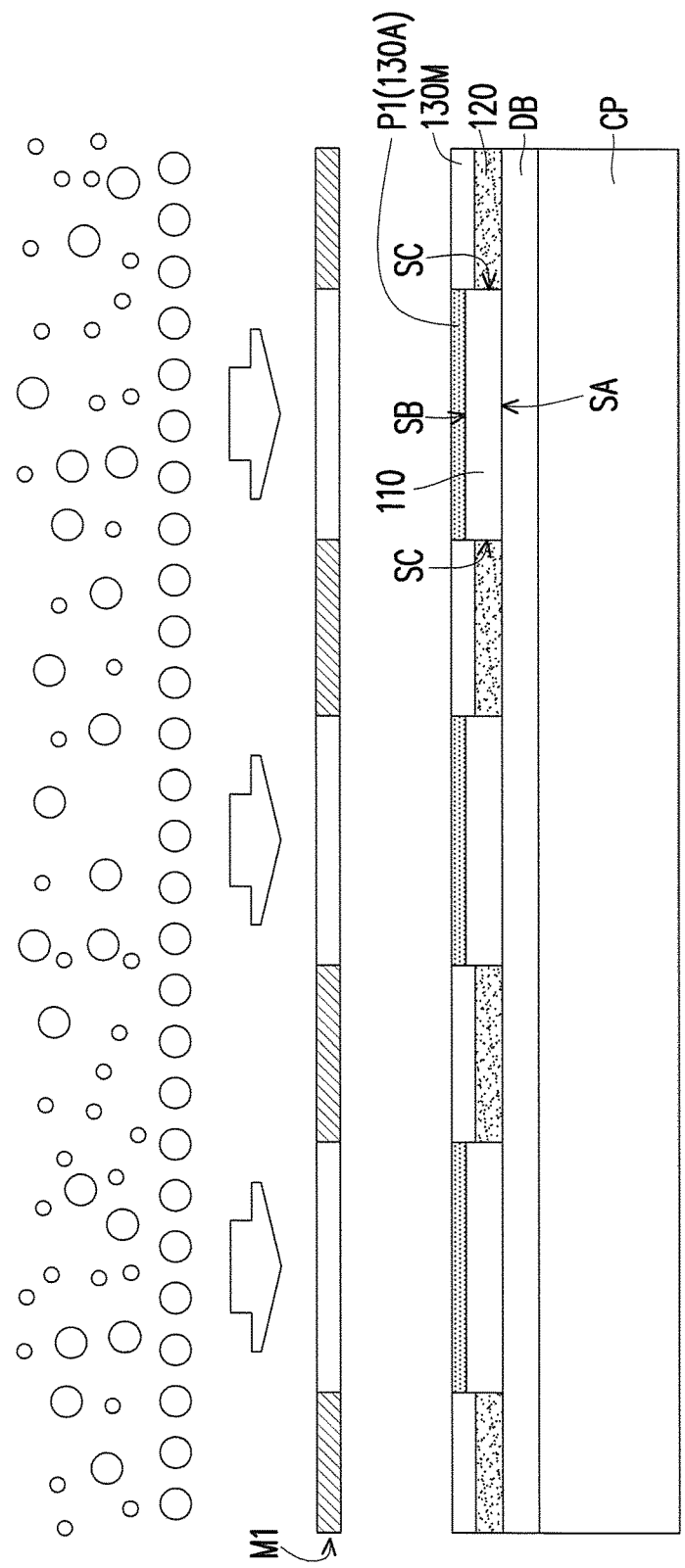
FIGS. 2A to 2C are schematic cross-sectional views illustrating part of a chip packaging method according to a second embodiment of the disclosure.
Figure 2B:
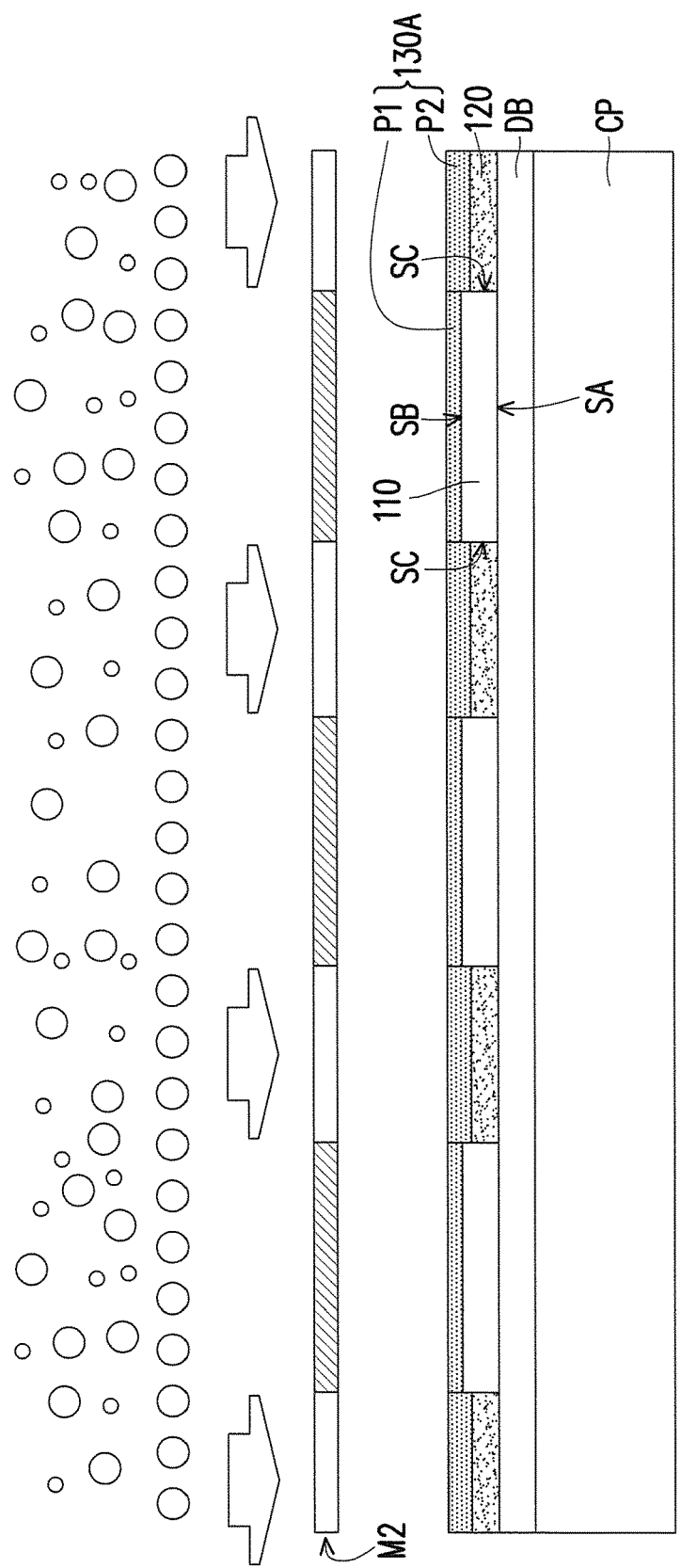
Figure 2C:
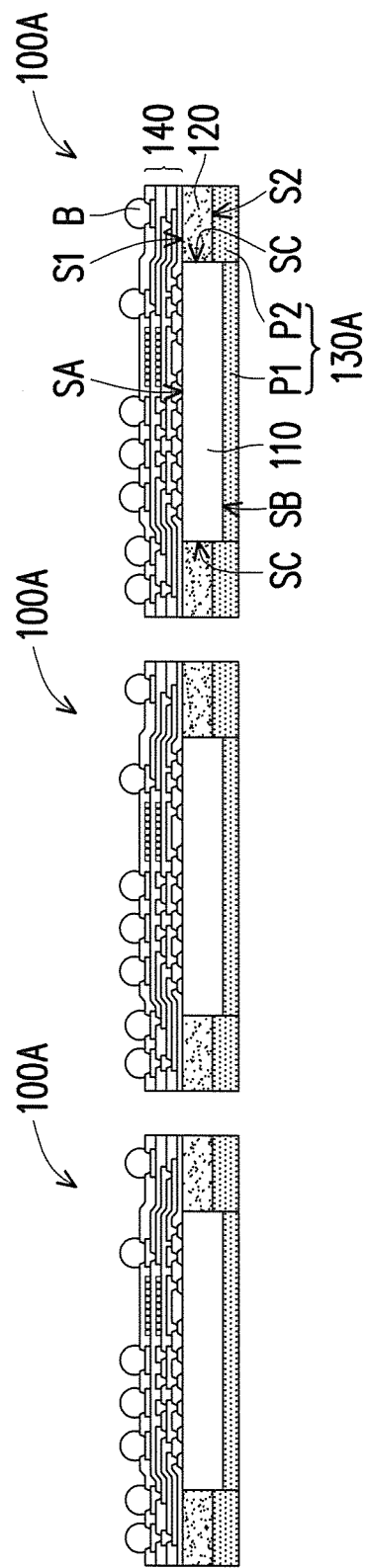

FIGS. 2A to 2C are schematic cross-sectional views illustrating part of a chip packaging method according to a second embodiment of the disclosure. The processes shown in FIGS. 2A and 2B serve to replace the process shown in FIG. 1D after the process shown in FIG. 1C.

Referring to FIG. 2A, after the process shown in FIG. 1C, a first mask M1 is provided. The first mask M1 exposes a region where the at least one chip 110 is located, and shields a region except where the at least one chip 110 is located. Then, using the first mask M1 as a mask, a surface treatment is performed on the second encapsulation material layer 130M on the at least one chip 110 at a first power, so as to form at least one first portion P1 of a second encapsulation layer 130A.

Referring to FIG. 2B, a second mask M2 is provided. The second mask M2 shields the region where the at least one chip 110 is located and exposes the region except where the at least one chip 110 is located. Then, using the second mask M2 as a mask, a surface treatment is performed on the second encapsulation material layer 130M on the first encapsulation layer 120 at a second power lower than the first power, so as to form a second portion P2 of the second encapsulation layer 130A. A thermal expansion coefficient of the second portion P2 is less than a thermal expansion coefficient of the at least one first portion P1.

In the embodiment, since the at least one first portion P1 and the second portion P2 are subjected to surface treatments with different power, the at least one first portion P1 and the second portion P2 have different thermal expansion coefficients and refractive indices. Since the refractive indices are different, the reflective properties are also different. Therefore, the different reflective properties in different regions of the second encapsulation layer 130A are able to be distinguished.

After the process shown in FIG. 2B, the peeling process and the reversing process shown in FIG. 1E may be performed. Then, the redistribution layer 140 and the conductive bumps B shown in FIG. 1F may be formed subsequently. Afterwards, referring to FIG. 2C, a plurality of chip packages 100A may be formed by performing a die cutting process.

The second encapsulation layer 130A of each of the chip packages 100A shown in FIG. 2C is formed by a plurality of (e.g., two) portions having different thermal expansion coefficients. The second encapsulation layer 130A has the at least one first portion P1 and the second portion P2, and the thermal expansion coefficient of the second portion P2 is less than the thermal expansion coefficient of the at least one first portion P1. The at least one first portion P1 is disposed on the back surface SB of the at least one chip 110. The second portion P2 and the at least one first portion P1 are connected. In addition, the second portion P2 is disposed on the second surface S2 of the first encapsulation layer 120. A patterned design of the second encapsulation layer 130A may facilitate releasing of a stress, so as to further reduce warpage.

It should be noted that, even though the first portion P1 and the second portion P2 of the second encapsulation layer 130A are defined based on the region where the chip 110 is located and the region except where the chip 110 is located, the disclosure is not limited thereto. In another embodiment, sub-portions having different thermal expansion coefficients may also be further defined in at least one of the first portion P1 and the second portion P2 of the second encapsulation layer 130A. In yet another embodiment, the first portion P1 of the second encapsulation layer 130A may correspond to a plurality of the chips 110. However, the disclosure is not limited thereto. In another embodiment, an order of fabricating the first portion P1 and the second portion P2 may be reversed. In other words, the process shown in FIG. 2B may also be performed after the process shown in FIG. 2A.

Figure 3:
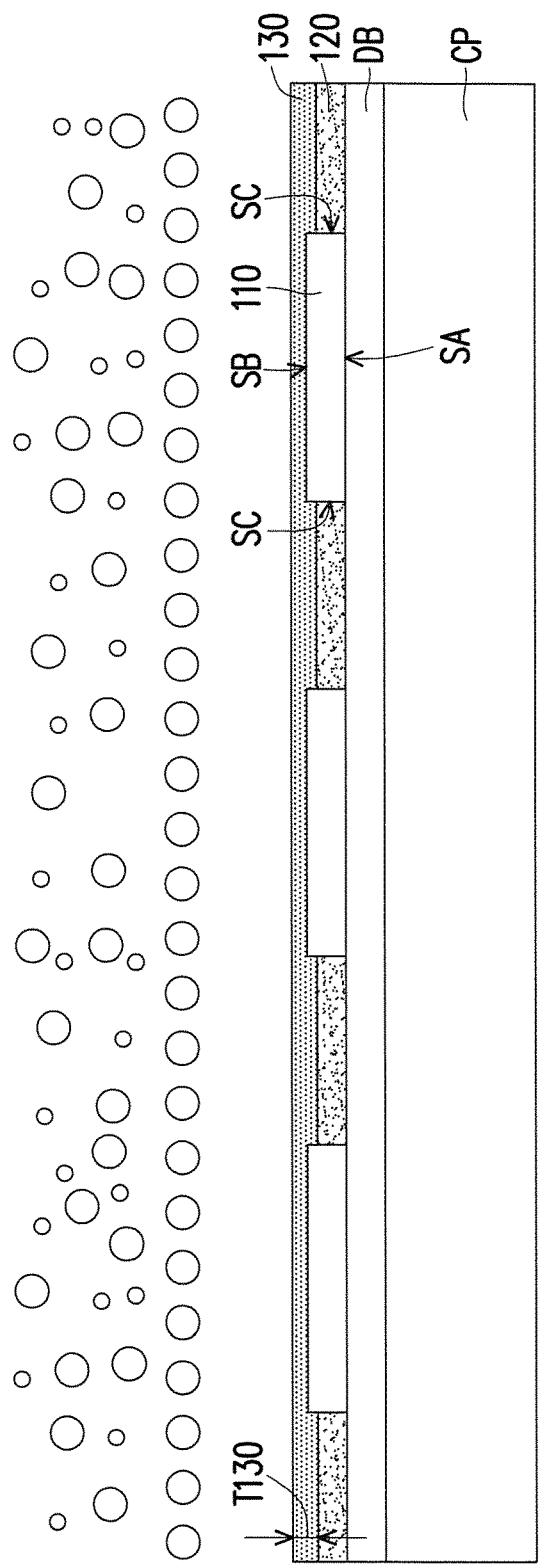
FIG. 3 is a schematic cross-sectional view illustrating part of a chip packaging method according to a third embodiment of the disclosure.

FIG. 3 is a schematic cross-sectional view illustrating part of a chip packaging method according to a third embodiment of the disclosure. The process shown in FIG. 3 is performed after the process shown in FIG. 1B and replaces the processes shown in FIGS. 1C and 1D.

Referring to FIG. 3, after the process shown in FIG. 1B, the second encapsulation layer 130 is formed on the first encapsulation layer 120 and the back surface SB of the at least one chip 110 by performing a vacuum deposition process. The vacuum deposition process may include a chemical vapor deposition process or a sputtering process. However, the disclosure is not limited thereto.

In a case when a thickness T130 of the second encapsulation layer 130 is thinner, the second encapsulation layer 130 may rise and fall following variation of the height of a carrying surface. In the embodiment, the second encapsulation layer 130 with a thicker thickness is formed, and a grinding process is then performed to minimize variation in thickness of the chip package formed subsequently. The grinding process may include a mechanical grinding process or a chemical mechanical polishing (CMP) process, for example.

After the step shown in FIG. 3, the peeling process and the reversing process shown in FIG. 1E may be performed, and the redistribution layer 140 and the conductive bumps B shown in FIG. 1F are then formed. Then, the die cutting process shown in FIG. 1G is performed to form the chip packages 100 shown in FIG. 1G.

Figure 4A:
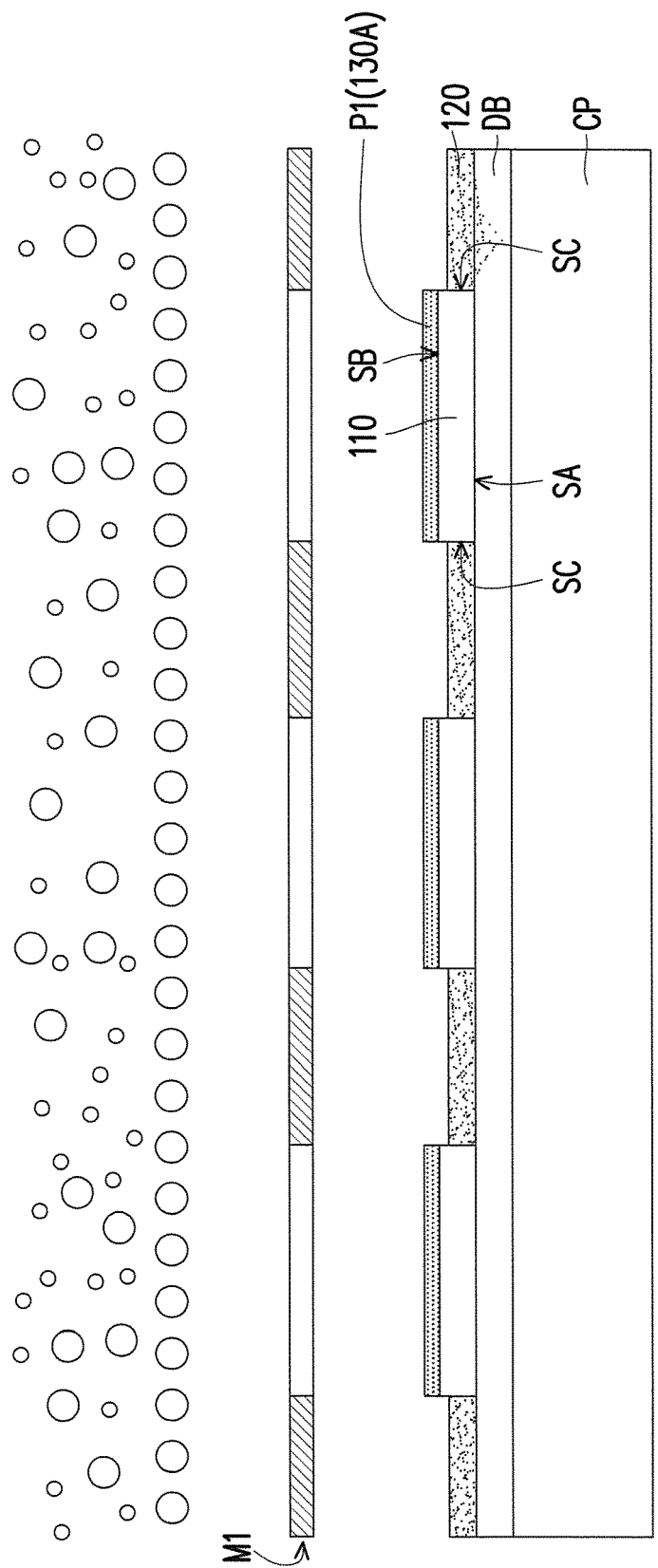
FIGS. 4A to 4B are schematic cross-sectional views illustrating part of a chip packaging method according to a fourth embodiment of the disclosure.
Figure 4B:
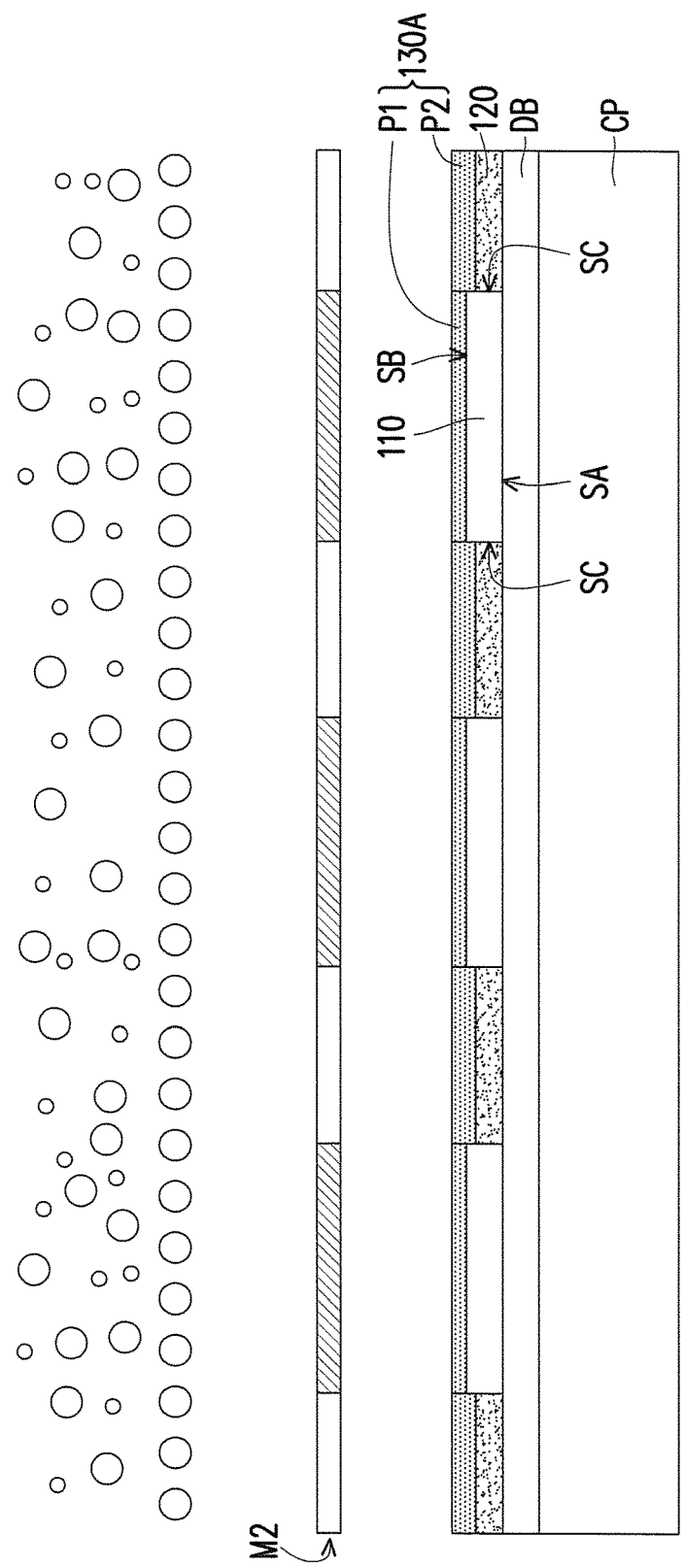

FIGS. 4A to 4B are schematic cross-sectional views illustrating part of a chip packaging method according to a fourth embodiment of the disclosure. The processes shown in FIGS. 4A and 4B are performed after the process shown in FIG. 1B and replace the processes shown in FIGS. 1C and 1D.

Referring to FIG. 4A, after the process shown in FIG. 1B, the at least one first portion P1 of the second encapsulation layer 130A may be formed by performing a vacuum deposition process. The first mask M1 is provided. The first mask M1 exposes the region where the at least one chip 110 is located, and shields the region except where the at least one chip 110 is located. Then, using the first mask M1 as a mask, the first portion P1 of the second encapsulation layer 130A is formed on the back surface SB of the at least one chip 110.

Referring to FIG. 4B, the second portion P2 of the second encapsulation layer 130A is formed by performing a second vacuum deposition process. The second mask M2 is provided. The second mask M2 shields the region where the at least one chip 110 is located and exposes the region except where the at least one chip 110 is located. Then, using the second mask M2 as a mask, the second portion P2 of the second encapsulation layer 130A is formed on the first encapsulation layer 120. The thermal expansion coefficient of the second portion P2 is less than the thermal expansion coefficient of the at least one first portion P1.

After the step shown in FIG. 4B, the peeling process and the reversing process shown in FIG. 1E may be performed, and the redistribution layer 140 and the conductive bumps B shown in FIG. 1F are then formed. Then, the die cutting process shown in FIG. 2C is performed to form the chip packages 100A shown in FIG. 2C.

In another embodiment, an order of fabricating the first portion P1 and the second portion P2 may be reversed. In other words, the process shown in FIG. 4B may also be performed after the process shown in FIG. 4A.

Figure 5B:
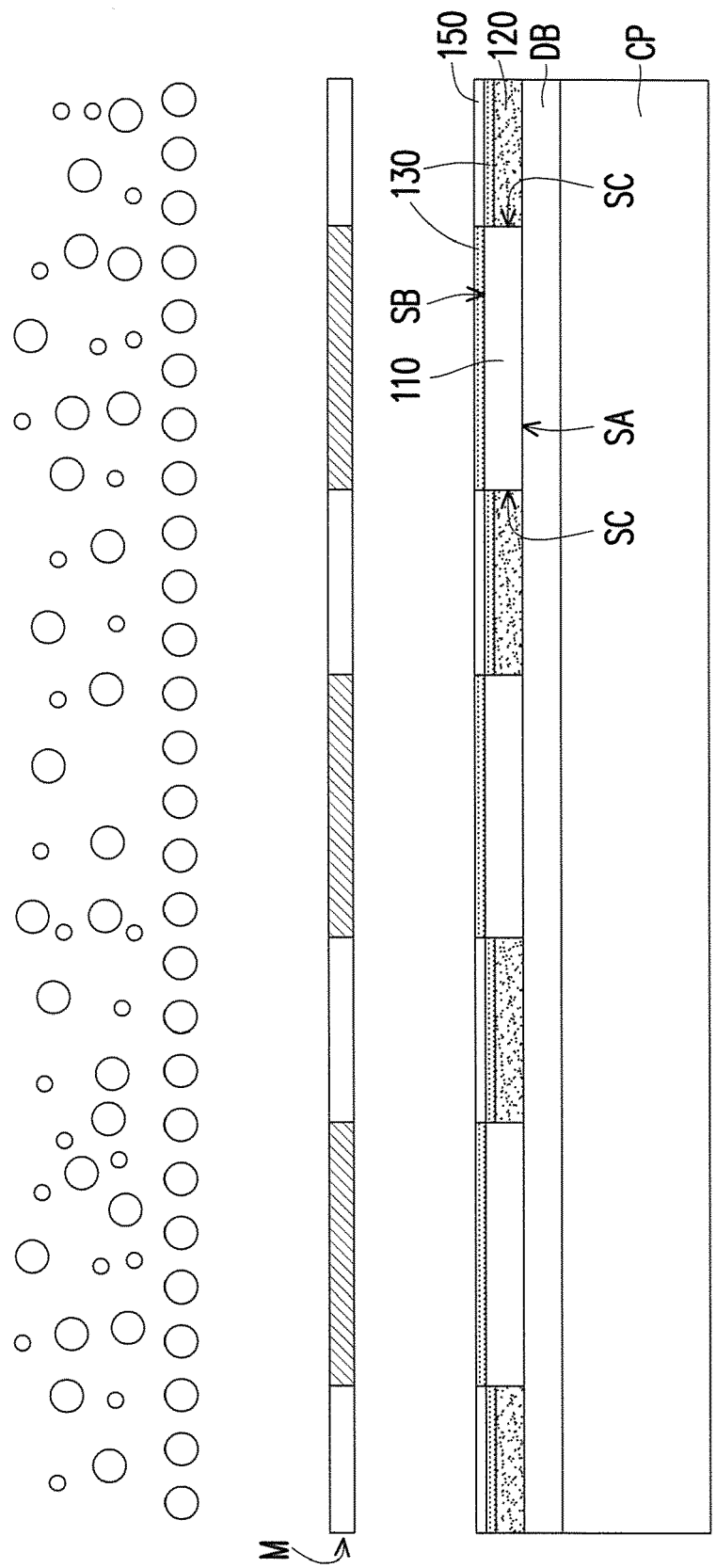

FIGS. 5A to 5B are schematic cross-sectional views illustrating part of a chip packaging method according to a fifth embodiment of the disclosure. The processes shown in FIGS. 5A and 5B are performed after the process shown in FIG. 1B and replace the process shown in FIGS. 1C and 1D.

Referring to FIG. 5A, by performing a vacuum deposition process, the second encapsulation layer 130 having a thinner thickness is formed on the first encapsulation layer 120 and the back surface SB of the at least one chip 110. In addition, the thermal expansion coefficient of the second encapsulation layer 130 is less than the thermal expansion coefficient of the first encapsulation layer 120.

Referring to FIG. 5B, by performing a vacuum deposition process, a third encapsulation layer 150 is formed on at least a portion of the second encapsulation layer 130. A mask M is provided. The mask M shields the region where the at least one chip 110 is located and exposes the region except where the at least one chip 110 is located. Then, using the mask M as a mask, the third encapsulation layer 150 is formed on the second encapsulation layer 130 on the first encapsulation layer 120. In addition, a thermal expansion coefficient of the third encapsulation layer 150 is less than the thermal expansion coefficient of the second encapsulation layer 130.

After the process shown in FIG. 5B, the peeling process and the reversing process shown in FIG. 1E may be performed. Then, the redistribution layer 140 and the conductive bumps B shown in FIG. 1F may be formed subsequently. Subsequently, referring to FIG. 5C, a plurality of chip packages 100B may be formed by performing a die cutting process.

Each of the chip packages 100B further includes the third encapsulation layer 150. The third encapsulation layer 150 is disposed on the second encapsulation layer 130 on the second surface S2 and exposes the second encapsulation layer 130 on the at least one chip 110. In addition, the thermal expansion coefficient of the third encapsulation layer 150 is less than the thermal expansion coefficient of the second encapsulation layer 130, and the third encapsulation layer 150 and the second encapsulation layer 130 may have different refractive indices.

A difference in thermal expansion coefficient between the at least one chip 110 and the encapsulation layer (i.e., the second encapsulation layer 130) on the at least one chip 110 may be reduced by forming the second encapsulation layer 130 having a less thermal expansion coefficient (closer to the thermal expansion coefficient of the at least one chip 110) on the back surface SB of the at least one chip 110. In addition, the first encapsulation layer 120 has at least one stress releasing hole accommodating the at least one chip 110 to release the stress of the first encapsulation layer 120. In addition, in the region except where the at least one chip 110 is located, the warpage may be suppressed by stacking the encapsulation layers with decreasing thermal expansion coefficients. Therefore, the non-polarity and warpage of the chip package 100B may be reduced, and the alignment precision of the chip package 100B may be facilitated.

Figure 6A:
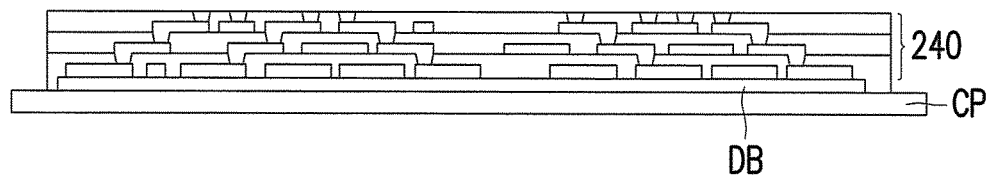
FIGS. 6A to 6H are schematic cross-sectional views illustrating a chip packaging method according to a sixth embodiment of the disclosure.

FIGS. 6A to 6H are schematic cross-sectional views illustrating a chip packaging method according to a sixth embodiment of the disclosure. Referring to FIG. 6A, a redistribution layer 240 is formed on the carrier CP. In the embodiment, before the redistribution layer 240 is formed in advance on the carrier CP, the releasing layer DB may be formed on the carrier CP. Then, the redistribution layer 240 may be formed on the releasing layer DB.

Figure 6B:
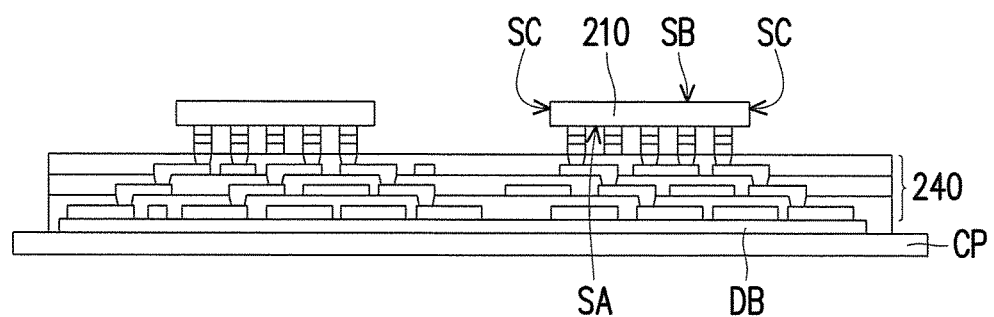

Referring to FIG. 6B, at least one chip 210 is disposed on the redistribution layer 240. The at least one chip 210 is electrically connected to the redistribution layer 240 and has the active surface SA, the back surface SB, and the sidewall surfaces SC. The back surface SB is opposite to the active surface SA, and the sidewall surfaces SC connect the active surface SA and the back surface SB. The at least one chip 210 is disposed on the redistribution layer 240 by flip chip, so as to locate the active surface SA between the back surface SB and the redistribution layer 240.

Figure 6C:
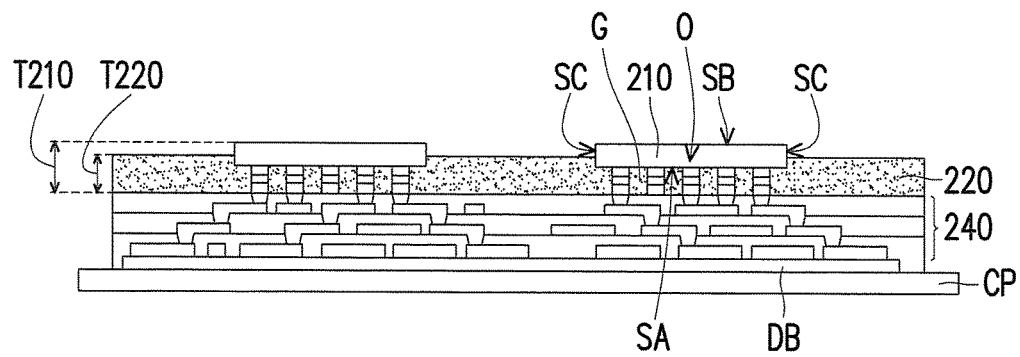

Referring to FIG. 6C, a first encapsulation layer 220 is formed on the redistribution layer 240. The first encapsulation layer 220 covers the sidewall surfaces SC of the at least one chip 210. In the embodiment, the first encapsulation layer 220 is further filled into a gap G between the at least one chip 210 and the redistribution layer 240. The first encapsulation layer 220 has at least one opening O accommodating the at least one chip 210. A location of the opening O is a location occupied by the at least one chip 210 in the first encapsulation layer 220. In addition, the number of the opening O may be the same as the number of the at least one chip 210. The opening O forms a stress releasing hole of the first encapsulation layer 220. Thus, the first encapsulation layer 220 is a patterned film.

In the embodiment, a thickness T220 of the first encapsulation layer 220 is less than a thickness T210 of the at least one chip 210. Based on different design needs, the thickness T220 of the first encapsulation layer 220 may also be greater than or equal to the thickness T210 of the at least one chip 210.

Figure 6D:
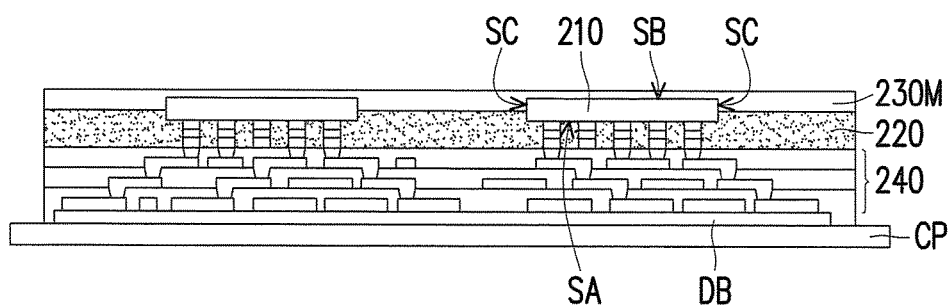

Referring to FIG. 6D, a second encapsulation material layer 230M is formed on the first encapsulation layer 220 and the back surface SB of the at least one chip 210. A material of the second encapsulation material layer 230M includes, for example, polysilazane compound, a polysilazoxane compound or a polysiloxane compound. However, the disclosure is not limited thereto.

Figure 6E:
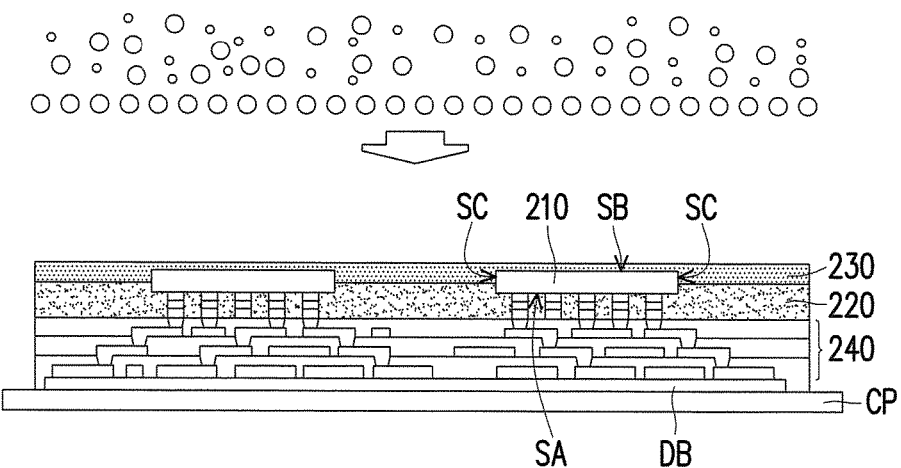

Referring to FIG. 6E, at least one surface treatment process, such as a plasma surface treatment, is performed on the second encapsulation material layer 230M, so as to form a second encapsulation layer 230 on the first encapsulation layer 220 and the back surface SB of the at least one chip 210. In addition, a thermal expansion coefficient of the second encapsulation layer 230 is less than a thermal expansion coefficient of the first encapsulation layer 220.

Figure 6F:
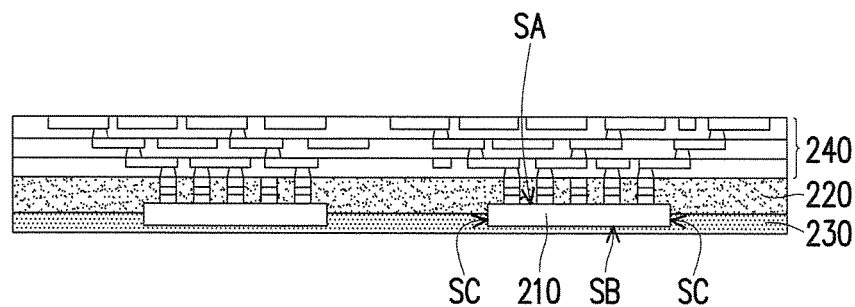

Referring FIG. 6F, the redistribution layer 240 is departed from the carrier CP. In the embodiment, the redistribution layer 240 is formed on the releasing layer DB, as shown in FIG. 6E. In the peeling process shown in FIG. 6F, the redistribution layer 240 departs from the releasing layer DB. After the peeling process, a reversing process may be performed to make the redistribution layer 240 face upward for subsequent processing.

Figure 6G:
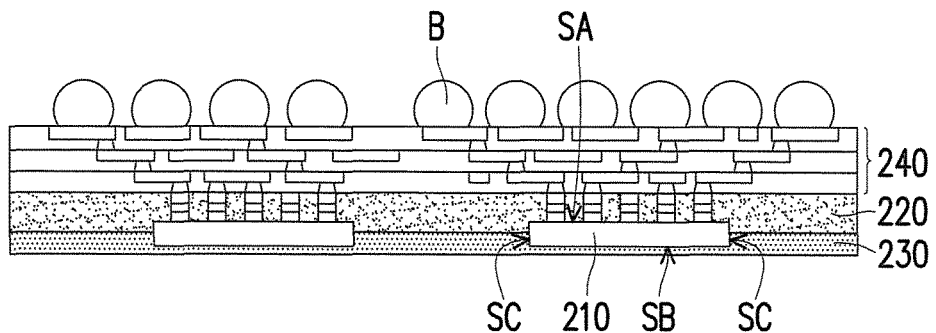

Referring to FIG. 6G, the conductive bumps B electrically connected to the redistribution layer 240 are formed on the redistribution layer 240. The conductive bumps B may be copper bumps, for example. However, the disclosure is not limited thereto.

Figure 6H:
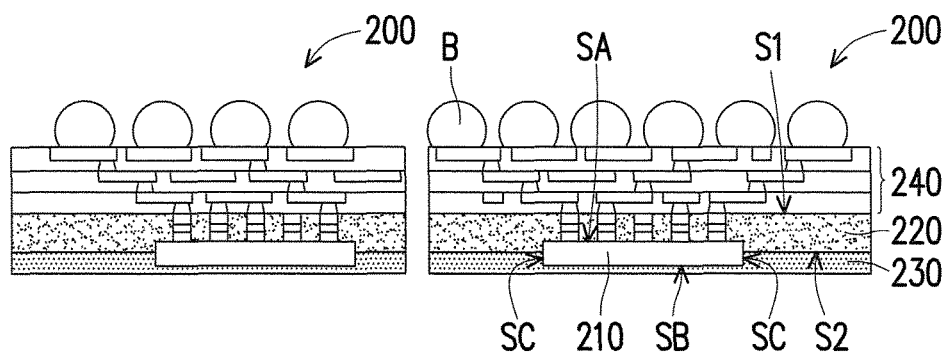

Referring to FIG. 6H, a plurality of chip packages 200 may be formed by performing a die cutting process. The chip package 200 has a structure similar to the structure of the chip package 100 shown in FIG. 1G. Thus, similar components are referred to by similar reference symbols, and details relating to the materials, relative relations of configuration, and effects of the components will not be repeated in the following.

In the embodiment, the second encapsulation layer 230 of the chip package 200 is formed by performing a molding process and a surface treatment process. However, the disclosure is not limited thereto. In another embodiment, the second encapsulation layer 230 may also be formed by performing a vacuum deposition process. Details in this respect are referred to the descriptions corresponding to FIG. 3, and thus will not be repeated in the following.

Figure 7:
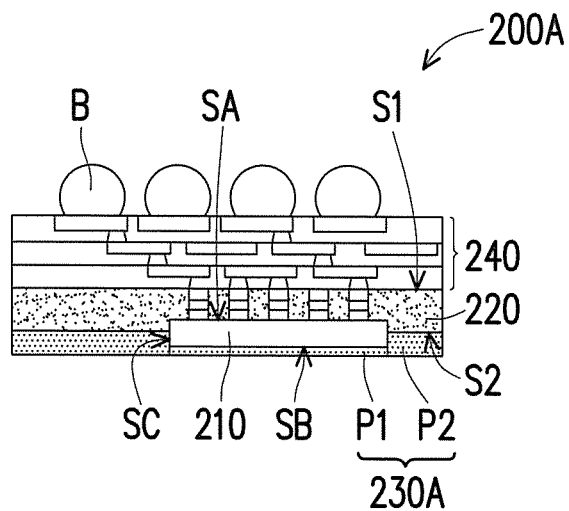
FIGS. 7 to 9 are respectively schematic cross-sectional views illustrating a chip package according to seventh to ninth embodiments of the disclosure.
Figure 8:
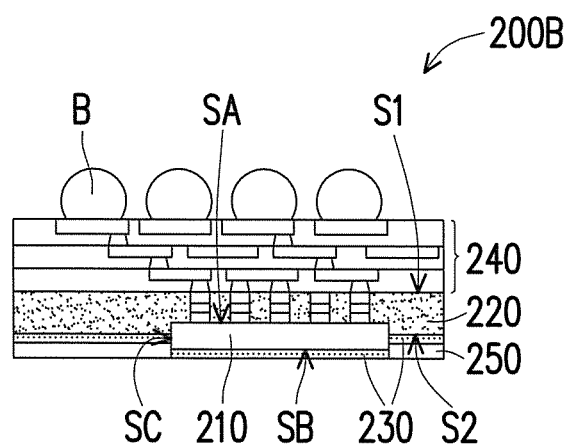
Figure 9:
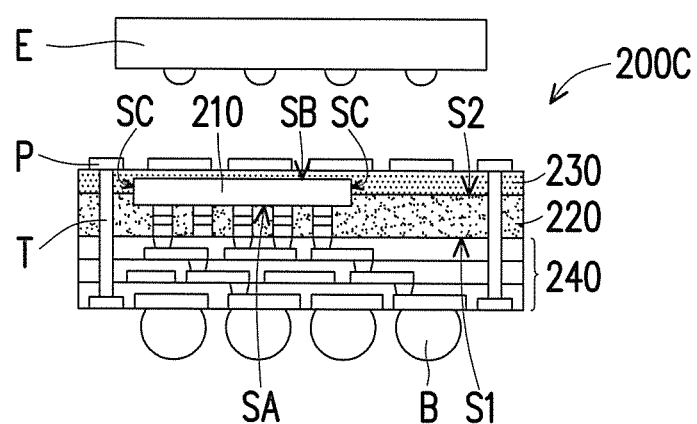

FIGS. 7 to 9 are respectively schematic cross-sectional views illustrating a chip package according to seventh to ninth embodiments of the disclosure. Like or similar components between FIGS. 7 to 9 and FIG. 6H are referred to with like or similar reference symbols, and details of the like or similar components will not be repeated in the following.

The second encapsulation layer 230 of each chip package 200 in FIG. 6H may be a continuous film having a uniform thermal expansion coefficient. A second encapsulation layer 230A of each chip package 200A shown in FIG. 7 is formed by a plurality of (e.g., two) portions having different thermal expansion coefficients. The second encapsulation layer 230A has the at least one first portion P1 and the second portion P2, and the thermal expansion coefficient of the second portion P2 is less than the thermal expansion coefficient of the at least one first portion P1. The at least one first portion P1 is disposed on the back surface SB of the at least one chip 210. The second portion P2 and the at least one first portion P1 are connected. In addition, the second portion P2 is disposed on the second surface S2 of the first encapsulation layer 220. A patterned design of the second encapsulation layer 230A may facilitate releasing of a stress, so as to further reduce warpage.

It should be noted that, even though the first portion P1 and the second portion P2 of the second encapsulation layer 230A are defined based on the region where the chip 210 is located and the region except where the chip 210 is located, the disclosure is not limited thereto. In another embodiment, sub-portions having different thermal expansion coefficients may also be further defined in at least one of the first portion P1 and the second portion P2 of the second encapsulation layer 230A. In yet another embodiment, the first portion P1 of the second encapsulation layer 230A may correspond to a plurality of the chips 210. However, the disclosure is not limited thereto.

The chip package 200A may be fabricated by performing the processes shown in FIGS. 2A and 2B after the process shown in FIG. 6D, and subsequently performing the processes shown in FIG. 6F to 6H. Alternatively, after performing the process shown in FIG. 6D, the processes shown in FIGS. 4A and 4B are performed, and then the processes shown in FIGS. 6F to 6H are performed. Relevant descriptions may be referred to the corresponding paragraphs, and thus not repeated in the following.

Referring to FIG. 8, a chip package 200B may further include a third encapsulation layer 250. The third encapsulation layer 250 is disposed on the second surface S2 of the second encapsulation layer 230 and exposes the second encapsulation layer 230 on the at least one chip 210. In addition, a thermal expansion coefficient of the third encapsulation layer 250 is less than the thermal expansion coefficient of the second encapsulation layer 230, and the third encapsulation layer 250 and the second encapsulation layer 230 may have different refractive indices.

A difference in thermal expansion coefficient between the at least one chip 210 and the encapsulation layer (i.e., the second encapsulation layer 230) on the at least one chip 210 may be reduced by forming the second encapsulation layer 230 having a less thermal expansion coefficient (closer to the thermal expansion coefficient of the at least one chip 210) on the rear surface of the at least one chip 210. In addition, the first encapsulation layer 220 has at least one stress releasing hole accommodating the at least one chip 210 to release the stress of the first encapsulation layer 220. In addition, in the region except where the at least one chip 210 is located, the warpage may be suppressed by stacking the encapsulation layers with decreasing thermal expansion coefficients. Therefore, the non-polarity and warpage of the chip package 200B may be reduced, and the alignment precision of the chip package 200B may be facilitated.

The chip package 200B may be fabricated by performing the processes shown in FIGS. 5A and 5B after the process shown in FIG. 6C, and subsequently performing the processes shown in FIG. 6F to 6H. Relevant descriptions may be referred to the corresponding paragraphs, and thus not repeated in the following.

Referring to FIG. 9, a chip package 200C may further include at least one conductive via T. The at least one conductive via T penetrates through the first encapsulation layer 220 and the second encapsulation layer 230. In addition, the at least one conductive via T is electrically connected to the redistribution layer 240. The chip package 200C may further include a plurality of pads P. The pads P are electrically connected to the redistribution layer 240 through the at least one conductive via T. Accordingly, the at least one chip 210 may be electrically connected to an electronic component E through the redistribution layer 240, the at least one conductive via T, and the pads P. The electronic component E is a memory, for example. However, the disclosure is not limited thereto.

Figure 5C:
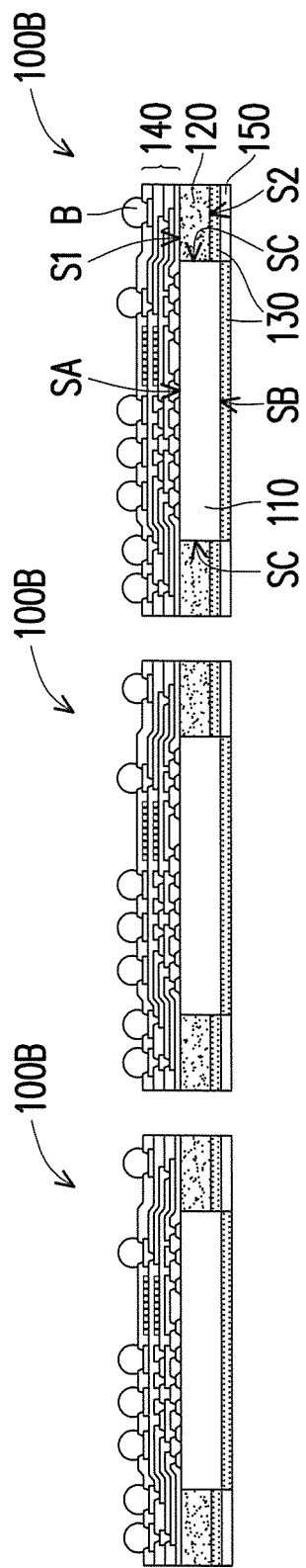

Even though the embodiment is modified based on the chip package 200 shown in FIG. 6H, the same modification is also applicable to the chip package 100 shown in FIG. 1G, the chip package 100A shown in FIG. 2C, the chip package 100B shown in FIG. 5C, the chip package 200A shown in FIG. 7, and the chip package 200B shown in FIG. 8. Thus, details in this respect will not be repeated in the following.

In the embodiments of the disclosure, the chip may be located at the stress releasing hole of the first encapsulation layer to facilitate the stress release of the first encapsulation layer. In addition, by setting the thermal expansion coefficient of the second encapsulation layer to be less than the thermal expansion coefficient of the first encapsulation layer, the difference in thermal expansion coefficient between the second encapsulation layer and the chip is reduced. The disclosure is able to reduce the non-planarity and warpage and facilitate the alignment precision, and is thus able to bring forth a preferable yield and a high yield rate of packaging. In an embodiment, the second encapsulation layer may have a patterned design to facilitate stress releasing, so as to further reduce warpage. In yet another embodiment, the warpage may be further reduced by stacking the encapsulation layers with decreasing thermal expansion coefficients in the region except where the chip is located.

It will be clear that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A chip packaging method, comprising:
   disposing at least one chip on a carrier, wherein the at least one chip has an active surface, a back surface opposite to the active surface, and a plurality of sidewall surfaces connecting the active surface and the back surface, and the active surface is located between the back surface and the carrier;
   forming a first encapsulation layer on the carrier, wherein the first encapsulation layer covers the sidewall surfaces of the at least one chip to expose the back surface of the at least one chip;
   forming a second encapsulation layer on the first encapsulation layer and the back surface of the at least one chip, wherein a thermal expansion coefficient of the second encapsulation layer is less than a thermal expansion coefficient of the first encapsulation layer, the second encapsulation layer has at least one first portion and a second portion, the at least one first portion is disposed on the back surface of the at least one chip, the second portion is connected to the at least one first portion, wherein the second portion and the at least one first portion are not overlapping, and a refractive index of the second portion is different from a refractive index of the at least one first portion;
   departing the at least one chip and the first encapsulation layer from the carrier to expose the active surface of the at least one chip; and
   forming a redistribution layer on the first encapsulation layer and the active surface of the at least one chip, wherein the redistribution layer is electrically connected to the at least one chip.

2. The chip packaging method as claimed in claim 1, wherein the step of forming the second encapsulation layer comprises:
   forming a second encapsulation material layer on the first encapsulation layer and the back surface of the at least one chip by performing a molding process; and
   performing at least one surface treatment process on the second encapsulation material layer to form the second encapsulation layer.

3. The chip packaging method as claimed in claim 2, wherein the at least one surface treatment process comprises:
   providing a first mask, wherein the first mask exposes a region where the at least one chip is located and shields a region except where the at least one chip is located;
   performing a surface treatment on the second encapsulation material layer located on the at least one chip by using the first mask as a mask at a first power to form at least one first portion of the second encapsulation layer;
   providing a second mask, wherein the second mask shields the region where the at least one chip is located and exposes the region except where the at least one chip is located; and
   performing a surface treatment on the second encapsulation material layer located on the first encapsulation layer by using the second mask as a mask at a second power lower than the first power to form a second portion of the second encapsulation layer, wherein a thermal expansion coefficient of the second portion is less than a thermal expansion coefficient of the at least one first portion.

4. The chip packaging method as claimed in claim 1, wherein the step of forming the second encapsulation layer comprises at least one vacuum deposition process.

5. The chip packaging method as claimed in claim 4, wherein the at least one vacuum deposition process comprises:
   providing a first mask, wherein the first mask exposes a region where the at least one chip is located and shields a region except where the at least one chip is located;
   using the first mask as a mask, forming at least one first portion of the second encapsulation layer on the back surface of the at least one chip;
   providing a second mask, wherein the second mask shields the region where the at least one chip is located and exposes the region except where the at least one chip is located; and
   using the second mask as a mask, forming a second portion of the second encapsulation layer on the first encapsulation layer, wherein a thermal expansion coefficient of the second portion is less than a thermal expansion coefficient of the at least one first portion.

6. The chip packaging method as claimed in claim 4, further comprising:
   providing a mask, wherein the mask shields a region where the at least one chip is located and exposes a region except where the at least one chip is located; and
   forming a third encapsulation layer on the second encapsulation layer located on the first encapsulation layer by using the mask, wherein a thermal expansion coefficient of the third encapsulation layer is less than the thermal expansion coefficient of the second encapsulation layer.

7. A chip packaging method, comprising:
   forming a redistribution layer on a carrier;
   disposing at least one chip on the redistribution layer, wherein the at least one chip is electrically connected to the redistribution layer and has an active surface, a back surface opposite to the active surface, and a plurality of sidewall surfaces connecting the active surface and the back surface, and the active surface is located between the back surface and the redistribution layer;
   forming a first encapsulation layer on the redistribution layer, wherein the first encapsulation layer covers the sidewall surfaces of the at least one chip to expose the back surface of the at least one chip;
   forming a second encapsulation layer on the first encapsulation layer and the back surface of the at least one chip, wherein a thermal expansion coefficient of the second encapsulation layer is less than a thermal expansion coefficient of the first encapsulation layer, the second encapsulation layer has at least one first portion and a second portion, the at least one first portion is disposed on the back surface of the at least one chip, the second portion is connected to the at least one first portion, wherein the second portion and the at least one first portion are not overlapping, and a refractive index of the second portion is different from a refractive index of the at least one first portion; and
   departing the redistribution layer from the carrier.

8. The chip packaging method as claimed in claim 7, wherein the step of forming the second encapsulation layer comprises:

forming a second encapsulation material layer on the first encapsulation layer and the back surface of the at least one chip by performing a molding process; and performing at least one surface treatment process on the second encapsulation material layer to form the second encapsulation layer.

9. The chip packaging method as claimed in claim 8, wherein the at least one surface treatment process comprises:

providing a first mask, wherein the first mask exposes a region where the at least one chip is located and shields a region except where the at least one chip is located;

using the first mask as a mask, performing a surface treatment on the second encapsulation material layer located on the at least one chip at a first power to form at least one first portion of the second encapsulation layer;

providing a second mask, wherein the second mask shields the region where the at least one chip is located and exposes the region except where the at least one chip is located; and using the second mask as a mask, performing a surface treatment on the second encapsulation material layer on the first encapsulation layer at a second power lower than the first power to form a second portion of the second encapsulation layer, wherein a thermal expansion coefficient of the second portion is less than a thermal expansion coefficient of the at least one first portion.

10. The chip packaging method as claimed in claim 7, wherein the step of forming the second encapsulation layer comprises at least one vacuum deposition process.

11. The chip packaging method as claimed in claim 10, wherein the at least one vacuum deposition process comprises:

providing a first mask, wherein the first mask exposes a region where the at least one chip is located and shields a region except where the at least one chip is located;

using the first mask as a mask, forming at least one first portion of the second encapsulation layer on the back surface of the at least one chip;

providing a second mask, wherein the second mask shields the region where the at least one chip is located and exposes the region except where the at least one chip is located; and using the second mask as a mask, forming a second portion of the second encapsulation layer on the first encapsulation layer, wherein a thermal expansion coefficient of the second portion is less than a thermal expansion coefficient of the at least one first portion.

12. The chip packaging method as claimed in claim 10, further comprising:

providing a mask, wherein the mask shields a region where the at least one chip is located and exposes a region except where the at least one chip is located; and forming a third encapsulation layer on the second encapsulation layer located on the first encapsulation layer by using the mask, wherein a thermal expansion coefficient of the third encapsulation layer is less than the thermal expansion coefficient of the second encapsulation layer.

* * * * *